(12) United States Patent
Finck et al.

(10) Patent No.: US 10,547,323 B2
(45) Date of Patent: Jan. 28, 2020

(54) SIGNAL PROCESSING DEVICE AND METHOD

(71) Applicant: D&M Holdings, Inc., Kanagawa (JP)

(72) Inventors: Rainer Finck, Eindhoven (NL); Shozo Kawahara, Kanagawa (JP)

(73) Assignee: D&M Holdings, Inc., Kanagawa (JP)

( * ) Notice: Subject to any disclaimer, the term of this patent is extended or adjusted under 35 U.S.C. 154(b) by 0 days.

(21) Appl. No.: 16/098,652

(22) PCT Filed: Apr. 25, 2017

(86) PCT No.: PCT/EP2017/059712
§ 371 (c)(1),
(2) Date: Nov. 2, 2018

(87) PCT Pub. No.: WO2017/190976
PCT Pub. Date: Nov. 9, 2017

(65) Prior Publication Data
US 2019/0149165 A1      May 16, 2019

(30) Foreign Application Priority Data
May 4, 2016 (GB) .................................. 1607784.4

(51) Int. Cl.
*H03M 3/00*       (2006.01)
*H03M 1/08*       (2006.01)
*H03M 7/32*       (2006.01)

(52) U.S. Cl.
CPC ......... *H03M 3/504* (2013.01); *H03M 1/0863* (2013.01); *H03M 7/3008* (2013.01)

(58) Field of Classification Search
CPC ... H03M 1/0863; H03M 3/504; H03M 7/3008

USPC .................................................. 341/118–165
See application file for complete search history.

(56) References Cited

U.S. PATENT DOCUMENTS

| | | | |
|---|---|---|---|
| 4,972,436 A * | 11/1990 | Halim | H03M 3/348 341/143 |
| 6,061,010 A | 5/2000 | Adams et al. | |
| 6,459,398 B1 | 10/2002 | Gureshnik et al. | |
| 6,717,539 B2 * | 4/2004 | Fischer | H03M 1/664 341/141 |

(Continued)

OTHER PUBLICATIONS

AK Design, Audio DAC Module datasheet; Jul. 18, 2014.
(Continued)

*Primary Examiner* — Lam T Mai
(74) *Attorney, Agent, or Firm* — Peter A. Nieves; Sheehan Phinney Bass & Green PA

(57) ABSTRACT

A bitstream converter for converting a 1-bit pulse density modulated (PDM) bitstream signal into an analog audio signal, the bitstream converter comprising: a processor configured to process the 1-bit PDM bitstream signal using a return to zero clock having a frequency higher than a sampling frequency of the 1-bit PDM bitstream signal to output a corresponding 1-bit return to zero signal, wherein the processor is configured to process the 1-bit PDM signal to ensure a portion of each bit of the 1-bit PDM bitstream signal is zero for a duration which is based on the frequency of the return to zero clock; and signal processing means configured to extract the analog audio signal from the 1-bit return to zero signal by filtering the 1-bit return to zero signal.

20 Claims, 5 Drawing Sheets

(56) References Cited

U.S. PATENT DOCUMENTS

| | | | |
|---|---|---|---|
| 7,205,918 B2* | 4/2007 | Niederdrank | H04R 25/505 |
| | | | 341/118 |
| 7,528,754 B1 | 5/2009 | Bakkaloglu et al. | |
| 7,561,084 B1* | 7/2009 | Wong | H03M 1/127 |
| | | | 341/123 |
| 8,736,475 B1 | 5/2014 | Harrison | |
| 2006/0012499 A1* | 1/2006 | Ihs | H03M 3/352 |
| | | | 341/143 |
| 2011/0148677 A1* | 6/2011 | Ihs | H03F 3/2175 |
| | | | 341/143 |
| 2014/0125504 A1* | 5/2014 | Braswell | H03M 3/344 |
| | | | 341/110 |
| 2014/0266833 A1* | 9/2014 | Kris | H03M 1/66 |
| | | | 341/144 |
| 2015/0061905 A1* | 3/2015 | Kappes | H03M 1/005 |
| | | | 341/120 |

OTHER PUBLICATIONS

Norsworthy S R et al., Delta-Sigma Data Converters, Jan. 1, 1997.
UKIPO Search Report for GB1607784.4; Nov. 28, 2016.
Uppal Nauman, Upsampling vs. Oversampling for Digital Audio Audioholics, Aug. 4, 2004.
PCT Search Report and Written Opinion for PCT/EP2017/059712 dated Aug. 17, 2017.

* cited by examiner

SIGNAL PROCESSING DEVICE AND METHOD

FIELD OF THE INVENTION

The present invention relates to a signal processing device for processing digital signals. In particular the present invention relates to a bitstream converter for processing bitstreams corresponding to an audio signal.

BACKGROUND OF THE INVENTION

Audio playback systems utilise digital data for the playback of (audio) sound recordings. However, audio output equipment, such as speakers, headphones and the like require an analog audio signal in order to function. Accordingly, in an audio playback system, a digital-to-analogue converter (DAC) is required to convert digital data into an analog audio signal.

Digital data corresponding to an analog audio signal can be provided to a DAC in a number of different formats. For example, one known format of digital data is Compact Disc Digital Audio. This format is a two-channel, 16-bit signal with pulse code modulation (PCM), and a 44.1 kHz sampling rate per channel. Another known data format is Direct Stream Digital™ (DSD). DSD is a 1-bit bitstream data format which uses pulse-density modulation.

Whatever choice of data format is provided as an input to the DAC, the role of the DAC is to convert a data signal into an analog audio signal as accurately as possible. This accuracy may be expressed in terms of a signal-to-noise ratio (SNR), with inaccuracy being equivalent to the introduction of a noise component by the DAC.

One main source of noise in digital signals is Intersymbol Interference (ISI). ISI is a form of distortion which occurs when one symbol interferes with subsequent symbols in a digital signal.

U.S. Pat. No. 6,061,010 discloses that in a DAC, ISI occurs when the output waveform for a particular clock period is a function not only of the digital code applied to the DAC for that clock period, but also of the digital code applied for a preceding clock period. This interference can cause both distortion and noise to appear at the DAC output.

U.S. Pat. No. 6,061,010 further discloses that in a DAC, ISI manifests itself by the area under the DAC output waveform for a given clock period (i.e. the time integral of the output), depending partly on the applied digital code (i.e. input signal value) during the previous clock period. In such a DAC, the accuracy of the area under the output waveform curve for a selected output sample is an extremely important measure of performance, as it contributes heavily to the purity of the low-frequency part of the output spectrum. That is, the output of an n-bit DAC comprises the sum of "n" analog waveforms, taking the form of a voltage or a current. In order for the DAC output to be free of ISI, each individual constituent analog bit waveform thus must be free of ISI (the output being a linear summation of the constituent waveforms).

In particular U.S. Pat. No. 6,061,010 discloses that ISI may result from unequal rise and fall times in the most significant bit output current. Conventionally, this kind of ISI is reduced by forcing the output bit to start from zero, reach its final value, and return to zero all within a single bit clock period (clock cycle). This is called a "return-to zero" (RTZ) code. Since there is a rise and a fall within every clock cycle, the area under each waveform pulse is guaranteed to be independent from prior bit values.

However, U.S. Pat. No. 6,061,010 explains that the RTZ approach is not without its limitations. The RTZ approach introduces full scale steps into the output waveform. This potentially degrades performance or causes problems in two ways. First, the operation of a circuit connected to receive the DAC output may become non-linear when driven by such large, high-speed steps. Second, any error in the clock edge timing, due to jitter or other mechanisms, may produce a large error in the output due to the large step size. In oversampled DACs, this is a particularly egregious problem, because sample-to-sample output current or voltage differences normally would be a small fraction of the full-scale range of the converter; however using an RTZ scheme, the average step size may be dramatically larger and the sensitivity to clock jitter may therefore be degraded seriously.

Thus the present inventor(s) propose the present invention with the knowledge that there is a need for a converter for converting bitstream (digital) signals to audio signals which has a high SNR.

SUMMARY OF THE INVENTION

In view of at least the above, in an aspect the present invention provides a bitstream converter according to claim 1. The present invention thereby provides a bitstream converter with improved SNR.

By encoding information on the 1-bit pulse density modulated (PDM) bitstream signal using pulse density modulation, a 1-bit PDM bitstream signal which is representative of an analog audio signal can be provided. Furthermore, by encoding the information using pulse density modulation, the information can be extracted from the signal by filtering.

The present inventors have realised that the return to zero clock can be used to ensure a portion of each bit of the 1-bit PDM signal is zero for a duration which is based on the frequency of the return to zero clock. Through the processing of the 1-bit PDM bitstream signal in this way, a 1-bit return to zero signal can be output which is free of ISI. Further, the present inventors have realised that the processing of the 1-bit PDM bitstream signal to output a 1-bit return to zero signal can be implemented using digital signal processing, by way of a digital signal processor.

The processing of the 1-bit PDM bitstream signal to output a corresponding 1-bit return to zero signal results in some of the signal power of the 1-bit PDM bitstream signal being lost. This is because compared with the 1-bit PDM bitstream signal, a portion of the 1-bit return to zero signal is forced to be zero. However, the present inventors have realised by ensuring that the frequency of the return to zero clock is higher than the frequency of the sampling frequency of the 1-PDM bitstream signal, the amount of signal power lost by the processing of the 1-bit PDM bitstream signal is reduced. Accordingly, the SNR of the bitstream converter is therefore increased.

Preferably, the frequency of the return to zero clock is at least 2, 3 or 4 times higher than the sampling frequency of the 1-bit PDM bitstream signal, such that the amount of signal power lost by the processing of the 1-bit PDM bitstream signal is reduced (minimised). Accordingly, the SNR of the bitstream converter is therefore increased.

Preferably, the present invention includes one or more filters in the signal processing means. The one or more filters are configured to filter the 1-bit return to zero signal. By filtering the 1-bit return to zero signal, an analog signal can be extracted (generated/produced) which contains the analog audio information e.g. for subsequent reproduction by audio equipment for generating sound.

The signal processing means may extract the analog audio signal from the 1-bit return to zero signal by demodulating the 1-bit return to zero signal. By demodulating the 1-bit return to zero signal, the analog audio signal is separated (extracted) from the sampling frequency of the 1-bit return to zero signal.

Preferably, the filter includes a finite impulse response filter which is configurable to filter noise resulting from the processing of the 1-bit PDM bitstream signal to output the corresponding 1-bit return to zero signal. By using a finite impulse response filter no phase distortion is added when the 1-bit return to zero signal is filtered. As discussed above, the noise resulting from the provision of the 1-bit return to zero signal is a high frequency noise.

For example, when a 1-bit PDM bitstream with a sampling frequency of 11.2 MHz is processed to produce a 1-bit return to zero signal, the 1-bit return to zero signal is set to zero for e.g. a quarter of each bit. The resulting return to zero portion of the 1-bit return to zero signal corresponds to a rectangular pulse that has a fundamental frequency of 45 MHz. As such, the 1-bit return to zero signal includes noise with a frequency of 45 MHz, plus all the uneven harmonics ($3^{rd}$, $5^{th}$, $7^{th}$, etc.) that correspond to the 45 MHz fundamental frequency. Therefore, the present inventors have realised that in order to provide a filter capable of removing such high frequency noise it is preferable to use a finite impulse response filter. By using a finite impulse response filter, the frequency response of the filter can be tuned to selectively remove the high frequency components of the 1-bit return to zero signal.

Preferably, the finite impulse response filter is implemented as a moving average finite impulse response filter, e.g. using digital signal processing. In this way, the present inventors have realised that rather than relying on a passive filter components to remove the high frequency noise, the moving average filter can be implemented using e.g. digital signal processing components which can be more easily integrated with other components of the bitstream converter.

More preferably, the moving average finite impulse response filter has an order of at least 2. The present inventors have realised that by providing a moving average finite impulse response filter with an order of at least 2, the frequency response of the moving average finite impulse response filter can be configured to filter noise resulting from the processing of the 1-bit PDM bitstream signal to provide the 1-bit return to zero signal, for a range of different frequency 1-bit PDM bitstream signals. The moving average finite impulse response filter may have an order of 7.

The 1-bit return to zero signal may be a 1-bit bipolar return to zero signal. The present inventors have realised that by providing a 1-bit bipolar return to zero signal, the SNR is further improved as a result of the 1-bit bipolar signal having a DC average of zero over time. The 1-bit bipolar return to zero signal may be generated differentially from a positive 1-bit unipolar return to zero signal and a negative 1-bit unipolar return to zero signal.

Preferably, the processor outputs the 1-bit bipolar return to zero signal as a differential signal. The processor may output a 1-bit unipolar return to zero signal and a complimentary 1-bit unipolar return to zero signal to differentially output the 1-bit bipolar return to zero signal. As such, the complimentary 1-bit unipolar return to zero signal is the opposite (compliment) of the 1-bit unipolar return to zero signal. By outputting the 1-bit bipolar return to zero signal as a differential signal, the 1-bit bipolar return to zero signal may have 3 signal levels (1, 0-1, for example) thereby reducing the amount of switching noise present in the 1-bit bipolar return to zero signal. Accordingly a bitstream converter with improved SNR can be provided.

The bitstream converter may also comprise an oversampling stage. The oversampling stage may be configurable to oversample an input bitstream signal to provide a 1-bit PDM bitstream signal. By oversampling an input bitstream signal to provide the 1-bit PDM bitstream signal, a range of different formats can be used for the input bitstream signal. In particular, different input bitstream signals with different clock frequencies can be used with the bitstream converter to provide a 1-bit PDM bitstream signal by varying the amount of oversampling provided by the oversampling stage.

Preferably the input bitstream signal is a multi-bit bitstream signal. The oversampling stage is configured to oversample the multi-bit signal, such as a PCM signal, to provide the 1-bit PDM bitstream signal.

Preferably the oversampling stage oversamples a sampling frequency of the input bitstream signal by a factor of at least 32. More preferably an oversampling factor of 64 or 256 is used. By oversampling the input bitstream signal sampling frequency, the sampling frequency of the 1-bit PDM bitstream signal can be increased. By increasing the sampling frequency of the 1-bit PDM bitstream signal, the amount of noise in the analogue audio signal can be reduced, and thus the SNR of the bitstream converter can be improved.

The oversampling stage may also include a noise shaping filter. By including a noise shaping filter in the oversampling stage, the SNR of bitstream converter can be increased.

Preferably, the noise shaping filter of the oversampling stage has an order of at least 2. By increasing the order of the noise shaping filter, the SNR of the converter can be further increased.

Preferably the 1-bit return to zero signal is a single 1-bit return to zero signal. The single 1-bit return to zero signal is filtered by the signal processing means to extract a single analog audio signal. The single 1-bit return to zero signal is processed from a single 1-bit PDM bitstream signal by the processor.

The bitstream converter according to a first aspect of the invention may be a bitstream demodulator. As such, the bitstream demodulator according to a first aspect of the invention comprises a processor which processes the 1-bit PDM bitstream to output a 1-bit return to zero signal. The 1-bit return to zero signal is processed by signal processing means to demodulate the 1-bit return to zero signal to extract an analog audio signal by filtering the 1-bit return to zero signal. Accordingly the bitstream demodulator may demodulate the 1-bit PDM bitstream to provide the analog audio signal.

In another aspect of the invention, a method of bitstream conversion according to claim 18 is provided. By converting a bitstream signal to an analog audio signal using this method, the amount of switching noise present in the analog audio signal is reduced, such that the SNR associated with this method is increased accordingly.

Preferably, the method of bitstream conversion includes filtering the 1-bit return to zero signal with a finite impulse response filter to remove noise produced by processing the 1-bit PDM bitstream signal to provide the corresponding 1-bit return to zero signal. By filtering this noise with a finite impulse response filter, the amount of switching noise in the analog audio signal is further reduced, such that the SNR associated with this method is increased accordingly.

The method of bitstream conversion may also include a step of oversampling an input bitstream signal to provide the 1-bit PDM bitstream signal. By oversampling the input bitstream signal to provide the 1-bit PDM bitstream signal, a range of different input bitstream signals with different clock frequencies can be used to provide the 1-bit PDM bitstream signal. Accordingly, the method of bitstream conversion can be used with a range of different input bitstream signals, in particular a range of different input bitstream signals with different clock frequencies.

In another aspect, the invention provides an audio playback device comprising a bitstream converter according to the first aspect of the invention. By including a bitstream converter according to the present invention in an audio playback device, noise resulting from the bitstream conversion in the audio playback device is greatly reduced. Therefore, the sound quality (SNR) of the audio playback is improved.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

Figure 1:
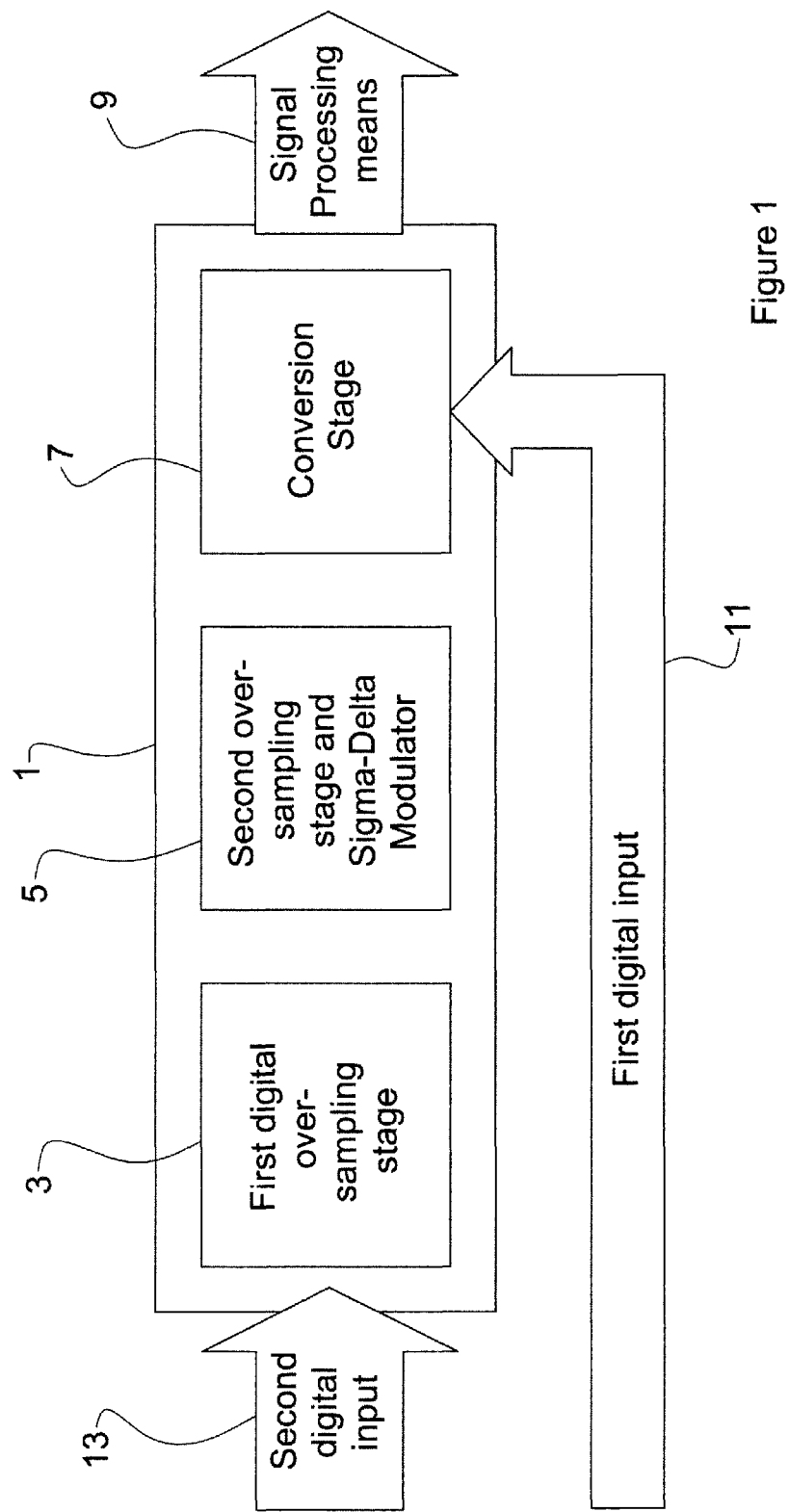
FIG. 1 shows a schematic diagram of a bitstream converter according to an embodiment of the invention. The bitstream converter stage can function with a direct DSD data input, or a PCM input which has been oversampled and sigma-delta modulated.

FIG. 1 shows a schematic diagram of a bitstream converter 1 according to a first embodiment of the invention. The bitstream converter 1 comprises a plurality of stages for converting an input bitstream signal into an analog audio signal. The bitstream converter includes a first oversampling stage 3, a second oversampling stage and sigma-delta modulator 5, a conversion stage (conversion processor, or converter) 7 and a signal processing means 9.

According to the first embodiment, the conversion stage 7 is implemented as a processor which converts a 1-bit PDM bitstream signal into a 1-bit return to zero signal. The conversion stage 7 outputs the 1-bit return to zero signal to the signal processing means 9.

As shown in FIG. 1, the conversion stage 7 can be provided directly with a 1-bit PDM bitstream signal via a first digital input 11. It is intended that 1-bit bitstream signals provided by the first digital input 11 will have audio information encoded using pulse density modulation. Preferably, the first digital input 11 provides a 1-bit PDM bitstream signal, for example according to the Direct Stream Data™ (DSD) format.

Alternatively, the conversion stage 7 can be provided with a 1-bit PDM bitstream signal originating from the second digital input 13 and which has been oversampled by one or more upstream oversampling stages 3, 5 provided between the second digital input 13 and the conversion stage 7.

The operation of the conversion stage 7 will be described in further detail later, but for now it suffices to say the conversion stage 7 converts a 1-bit PDM bitstream signal (received from an upstream oversampling stage 3, 5, or from the first digital input 11) into a 1-bit return to zero signal.

The signal processing means 9 processes the 1-bit return to zero signal output by the conversion stage 7 to provide (extract) the analog audio signal, for example by filtering the 1-bit return to zero signal. Accordingly, the signal processing means 9 is preferably configured to filter the 1-bit return to zero signal, to provide the analog audio signal.

The analog audio signal is an analog signal suitable for (ultimately) driving an audio output device, such as speaker, to generate sound. As such the analog audio signal preferably contains frequencies at least in the range 10 Hz to 20 kHz, and more preferably 10 Hz to 50 kHz, frequencies which correspond to the range of frequencies audible by humans. Accordingly, the input bitstream signal contains audio information which corresponds to the analog audio signal.

The bitstream signal provided to either the first or second digital inputs 11, 13 is encoded with the audio information which corresponds to the analog audio signal. The audio information can be encoded in a number of different formats, as the skilled person in the art would be aware. Examples of commonly used encoding formats for audio information on a bitstream signal includes Direct Stream Digital™ and Compact Disc Digital Audio (CDDA).

One preferable encoding scheme to use is pulse density modulation (PDM). With PDM, the density of pulses in a 1-bit PDM bitstream signal corresponds to the analog signal level. The individual pulses can be detected by a rising edge of the bitstream signal (or alternatively a falling edge), thus the bitstream signal is tolerant of noise on the bitstream signal line. A further advantage of PDM is that the PDM signal does not require a complex electronic circuit to convert the signal into an analog signal (compared with PCM). Instead, PDM signals only require a low pass filter to convert the 1-bit PDM bitstream signal into a corresponding analog signal. Of course, further electronic components can be included in addition to the low pass filter in order to change the characteristics of the analog signal encoded on the bitstream during the conversion process, in particular the SNR of the (analog) signal. One example of a well-known PDM data format is Direct Stream Digital™ (DSD) data. DSD data streams are 1-bit bitstream signals encoded with PDM using a 2.8 MHz sampling frequency.

Alternatively, audio information can be encoded on a bitstream signal using Pulse Code Modulation (PCM). An example of a PCM encoding format is Compact Disc Digital Audio (CD-DA). In PCM, an analog signal is sampled at a sampling rate, and the analog signal level for each sample quantized as a digital value. As such, PCM signals are typically multi-bit signals in order to reduce the level of quantization noise introduced by the quantization process.

According to the first embodiment of the present invention, a PCM signal can be used as an input bitstream signal to the bitstream converter 1 via second digital input 13. The first embodiment converts the PCM signal, which can be a multi-bit signal into a 1-bit PDM bitstream signal in the oversampling stage. The oversampling stage oversamples the PCM signal. The oversampling factor is at least eight times the sampling frequency of the PCM signal. Preferably, the oversampling factor is 32, 64, 128, 256 or 512 times the sampling frequency of the PCM signal. By increasing the oversampling factor, the amount of switching noise present in the converted analog audio signal is reduced. Preferably, a maximum oversampling factor 1064 times the PCM sampling frequency. By limiting the oversampling ratio, the frequency of the switching noise generated is reduced, making the switching noise easier to filter with inexpensive components. Furthermore, the electronics required to perform the oversampling are more economic if the oversampling rate is reduced.

Preferably, a CD-DA signal with a sampling frequency of 44.1 kHz, 48 kHz, or multiples thereof is oversampled to produce a 1-bit PDM bitstream signal with a sampling frequency of 11.2 MHz.

In order to produce a 1-bit PDM bitstream signal from a multi-bit PCM signal, it is also necessary to convert the multi-bit signal into a 1-bit signal. Preferably, this is achieved using a delta-sigma modulator 5. Delta-sigma modulators are known in the art, and will therefore not be described in further detail here. The delta-sigma modulator 5 converts the multi-bit signal into a 1-bit PDM bitstream signal. As such, the audio information on the 1-bit PDM bitstream signal is encoded with PDM.

Figure 2:
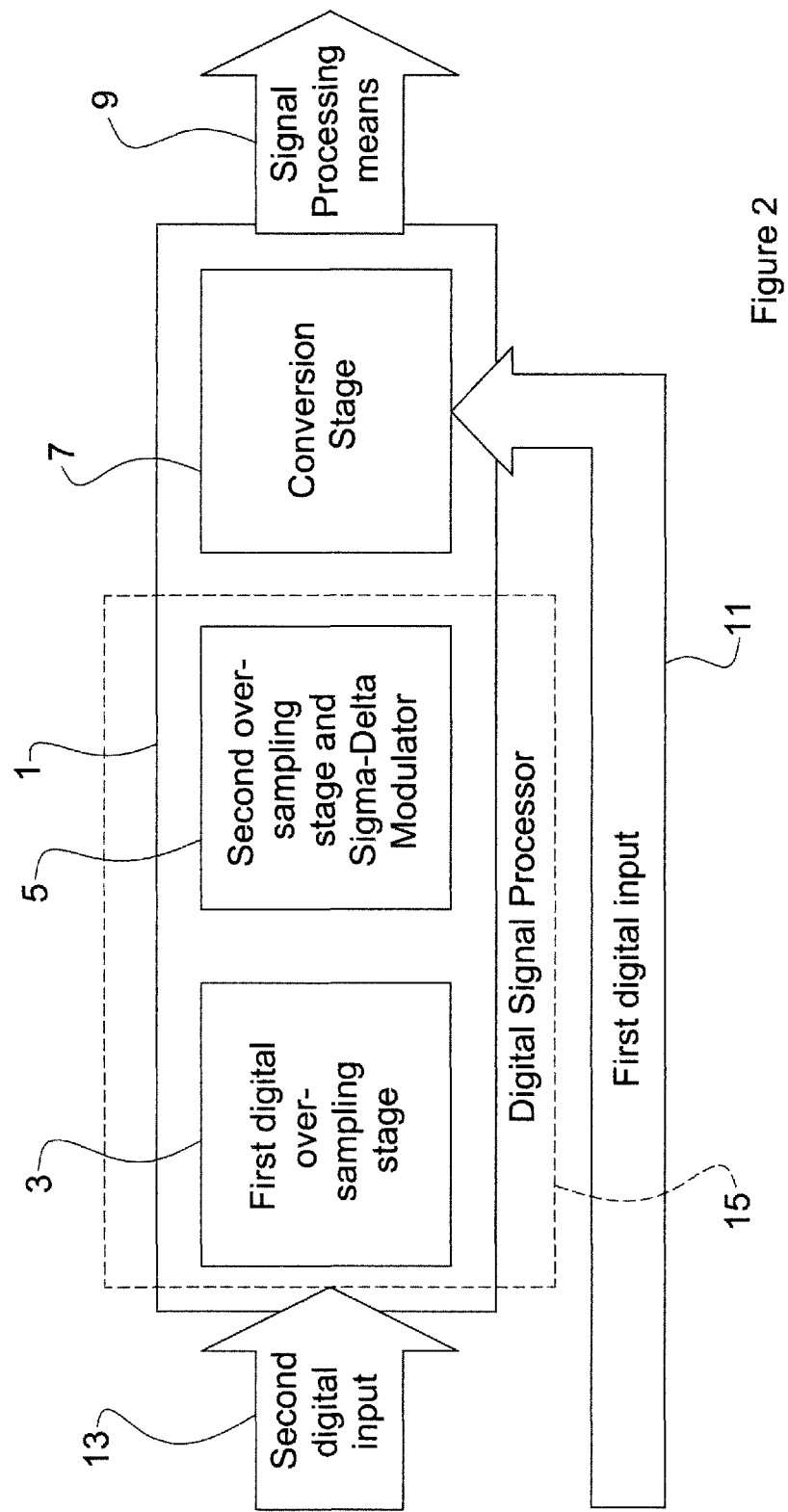
FIG. 2 shows a schematic diagram of a bitstream converter according to an embodiment of the invention where the oversampling stages are implemented using digital signal processing.

As shown in FIG. 2 the bitstream converter 1 converts a 1-bit PDM bitstream signal into an analog audio signal. The 1-bit PDM bitstream signal can be provided, for example, from a PCM input signal which has been oversampled, or a PDM 1-bit bitstream signal, such as DSD data stream, as described above. FIG. 2 shows that several stages in the bitstream converter can be implemented using a processor. The processor can be implemented as a microprocessor including a computer program configured to perform signal processing, for example. Alternatively, the processor can be a series of electronic components configured to process the 1-bit PDM bitstream signal, for example.

As discussed above, the conversion stage 7 of the bitstream converter is configured to process a received 1-bit PDM bitstream signal and output a corresponding 1-bit return to zero signal.

Figure 3:
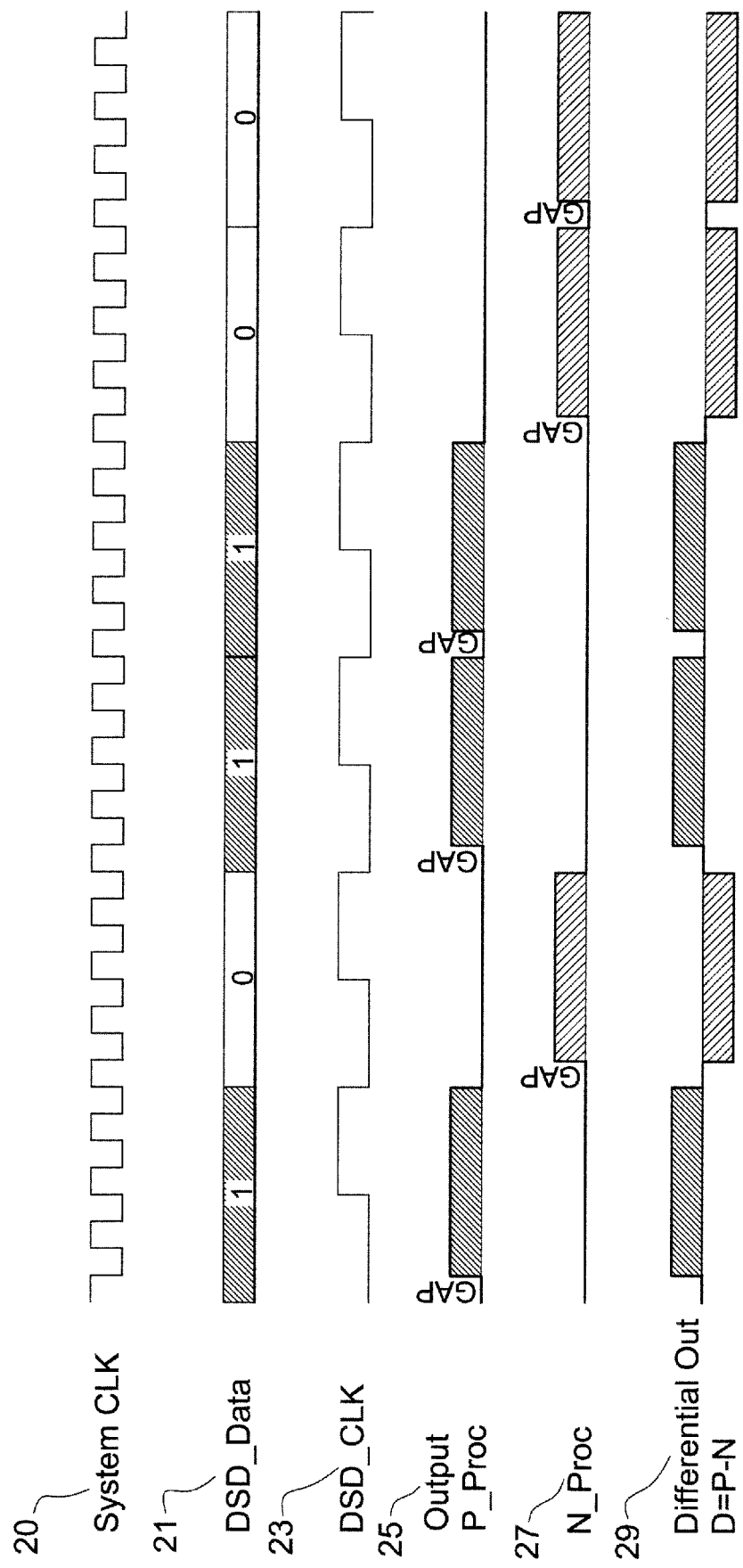
FIG. 3 shows a timing diagram of signals in the bitstream converter according to an embodiment of the invention.

FIG. 3 shows a timing diagram of signals which relate to the operation of the bit stream converter. As shown by the example in FIG. 3, the 1-bit return to zero signal (for example the output signal 25) corresponds with the 1-bit PDM bitstream signal (for example the DSD_Data signal 21), however, the 1-bit return to zero includes a blank (or zero) period in every bit (the blank period corresponding to the period labelled GAP in FIG. 3).

In the blank period the 1-bit return to zero signal is set to zero for a portion of each bit. In FIG. 3, the blank period is at the start of every bit. As such, the blank period at the start of the bit delays the rising edge of a "1" bit. Alternatively, the blank period can be provided at the end of every bit. As such the blank period curtails the duration of a "1" bit. In another alternative embodiment, the blank period overlaps the end of one bit and the start of the next bit. In this way, the blank period ensures that the 1-bit return to zero signal is set to zero between one bit and the next bit for each bit (i.e. between successive bits).

By including a blank period in the 1-bit return to zero signal, this ensures that every bit in the 1-bit return to zero signal starts from, and returns to, zero for every bit. In contrast, in the 1-bit PDM bitstream signal, the initial signal level at the start of every bit depends on the signal level at the end of the previous bit. Therefore, the 1-bit PDM bitstream signal can contain ISI, as the signal level can depend on the previous bit signal level. However, by processing the 1-bit PDM bitstream signal to output a 1-bit return to zero signal, ISI is removed from the 1-bit return to zero signal.

According to preferred embodiments, an optional further refinement is employed whereby the 1-bit return to zero signal is a 1-bit bipolar return to zero signal. As shown in FIG. 3, the 1-bit bipolar return to zero signal is generated from the 1-bit PDM bitstream signal as a differential signal. FIG. 3 shows that the 1-bit PDM bitstream signal (DSD_data 21) is processed to generate a P_Proc signal 25 and an N_Proc signal 27. The P_Proc signal 25 provides a corresponding "1" bit for every "1" bit in the 1-bit PDM bitstream signal. The N_Proc 27 signal provides a "1" bit for every "0" bit in the 1-bit PDM bitstream signal. In addition, the P_Proc 25 and N_Proc 27 signals are switched with the return to zero clock 20 to include a blank period. The P_Proc and N_Proc signals are then differentially combined to generate a 1-bit bipolar return to zero signal (Differential Out signal 29). In the 1-bit bipolar return to zero signal 29, a positive bit corresponds to a "1" in the original 1-bit PDM bitstream signal, while a negative bit corresponds to a "0" in the original 1-bit PDM bitstream signal. In this case, a signal level of zero has no meaning. However, return to zero coding ensures that each bit starts from, and returns to zero, so that each bit is independent of the previous bit. Thus ISI is eliminated between the bits. Furthermore, as the zero signal level is midway between the "1" bit signal level (positive) and the "0" bit signal level (negative), the signal amplitude that is required to switch each bit is reduced, relative to the total signal amplitude. Thus the switching noise is further reduced compared to a unipolar 1-bit return to zero signal. Furthermore, the DC average of the 1-bit bipolar return to zero signal encoding is also zero, compared to a 1-bit unipolar return to zero signal.

According to preferred embodiments, the "GAP" period as shown in FIG. 3 (the portion of each bit of the 1-bit PDM bitstream being set to zero) is provided by processing the 1-bit PDM bitstream signal with a return to zero clock 20, to ensure that a portion of each bit of the 1-bit PDM signal is zero for a period of time based on the frequency of the return to zero clock.

The return to zero clock 20 runs at a higher frequency than the sampling frequency of the 1-bit PDM bitstream signal. For example, FIG. 3 shows the return to zero clock 20 (System CLK) and 1-bit PDM digital signal clock 23 (DSD_CLK) which corresponds to the sampling frequency of the 1-bit PDM bitstream signal. Preferably, the return to zero clock frequency is at least 2 times greater than the sampling frequency of the 1-bit PDM bitstream signal. More preferably the return to zero clock frequency is at least 3, 4, 6, or 8 times greater than the sampling frequency of the 1-bit PDM bitstream signal. By increasing the return to zero clock frequency relative to the sampling frequency of the 1-bit PDM bitstream signal, the duration of the "GAP" period is reduced. Thus, the amount of signal power lost as a result of the "GAP" period is reduced.

Preferably, the return to zero clock frequency is no greater than 100 times the sampling frequency of the 1-bit PDM bitstream signal. If the return to zero clock frequency is too high, the frequency of the resulting switching noise produced is also very high, which is difficult to filter. Furthermore, if the "GAP" period is very short in duration, then the 1-bit return to zero signal may not have enough time to fall fully back to zero, therefore resulting in ISI. For example, a 1-bit bitstream signal with a sampling frequency of 11.2 MHz can be processed by a processor with a return to zero clock of 44.8 MHz.

According to the first embodiment, the duration of the portion for which each bit of the 1-bit PDM bitstream signal is set to zero ("GAP") is based on the frequency of the return to zero clock. As shown in FIG. 3 the duration of the portion ("GAP") is based on the duration of a single clock pulse of the return to zero clock. In this embodiment, only a single clock pulse of the return to zero clock is used to set the duration of the portion in order to minimise the duration of the portion based on the frequency of the return to zero clock. Alternatively, more than one clock pulse of the return to zero clock can be used to set the duration of the portion, in order to increase the duration of the portion relative to the return to zero clock frequency.

The 1-bit return to zero signal is processed by signal processing means 9. The signal processing means 9 extracts an analog signal from the 1-bit return to zero signal. The signal processing means extracts the analog audio signal by filtering the 1-bit return to zero signal. By filtering the 1-bit return to zero signal, frequencies which are not desired in the analog audio signal, such as the frequencies generated by processing the 1-bit PDM bitstream signal to output the 1-bit return to zero signal can be removed.

The signal processing means 9 extracts the analog audio signal by demodulating the 1-bit return to zero to remove the sampling frequency of the 1-bit return to zero signal, and thus provides the audible frequencies which correspond to the analog audio signal.

According to the first embodiment, the 1-bit PDM bitstream signal is a PDM signal. As such, the 1-bit return to zero signal also contains audio information which is encoded with PDM. Therefore, by low pass filtering the 1-bit return to zero signal, the analog audio signal can be extracted. Furthermore, low pass filtering also removes the high frequency switching noise that is generated when the 1-bit PDM bitstream signal is processed to output the 1-bit return to zero signal.

Figure 4:
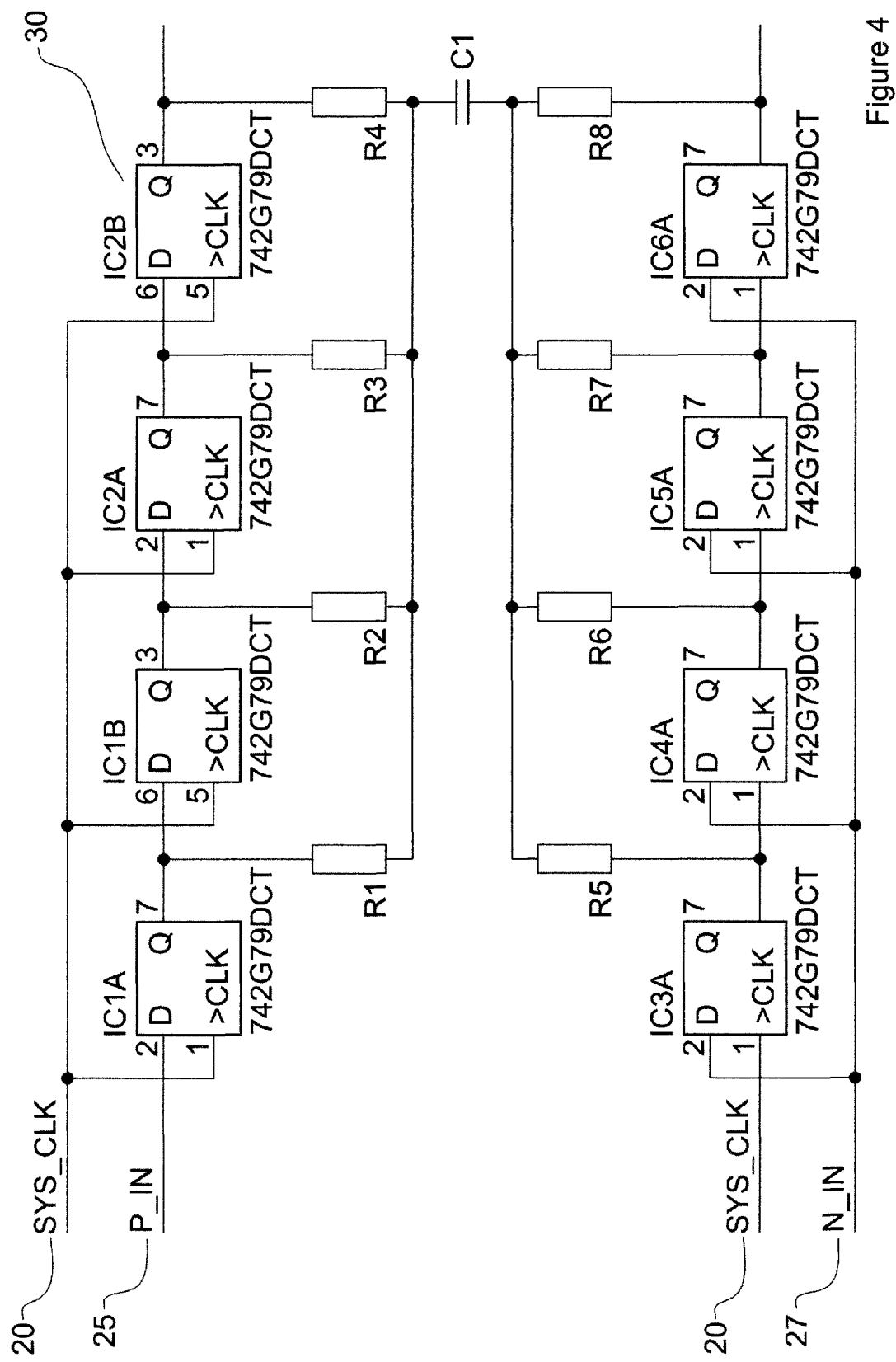
FIG. 4 shows a circuit diagram of a moving average finite impulse response filter according to an embodiment of the present invention.

According to preferred embodiments, the low-pass filter is implemented using a moving average finite impulse response filter 30 as shown in FIG. 4. The moving average finite impulse response filter 30 includes a chain of D-type flip-flops, configured in a shift register formation. In order to process a differential signal, the moving average finite impulse response filter according to the first embodiment includes two shift registers, one for the P-Proc signal 25 and one for the N_Proc signal 27. Of course, the skilled person appreciates that if processing of a unipolar signal was required, then only one shift register would be necessary.

The configuration and operation of a shift register arrangement of D-type flip-flops is known in the art, and is not further described.

In the embodiment shown in FIG. 4, there are 4 stages of D-type flip-flop in each shift register. As such IC1A, IC1B, IC2A, and IC2B forms a first shift register, and IC3A, IC4A, IC5A and IC6A forms a second shift register. Alternatively, the moving average finite impulse response filter may have no more than 16, 12 or 8 stages. By reducing the number of stages, the complexity of the moving average finite impulse response filter is reduced, and therefore the cost of implementing the moving average finite impulse response filter is reduced. Alternatively, the moving average finite impulse response filter may have at least 2 stages. By increasing the number of stages, the frequency response of the moving average finite impulse response filter can be configured to have improved filtering of high frequencies, thus improving the SNR of the DAC.

Figure 5:
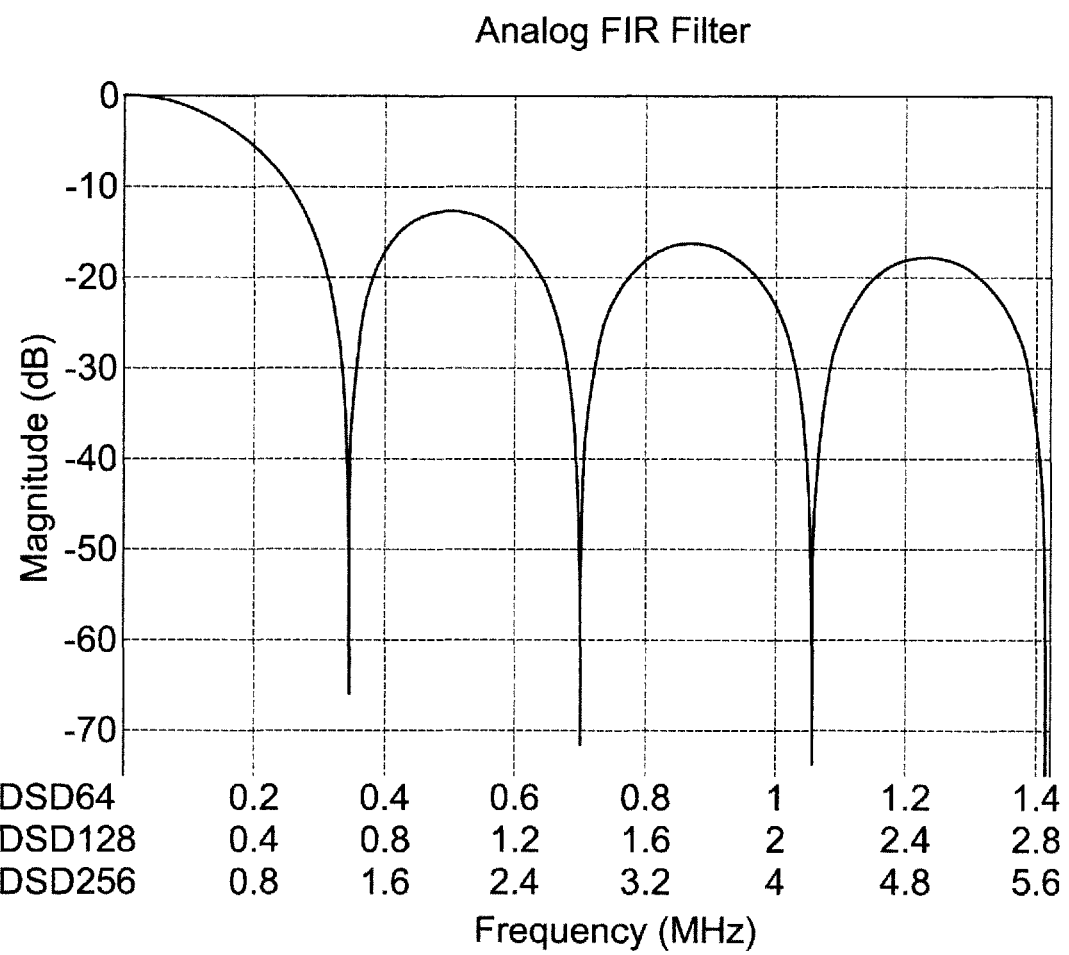
FIG. 5 shows a frequency response of a moving average finite impulse response filter according to an embodiment of the present invention.

The outputs of each of the flip-flop stages in the first and second shift registers are connected to a low-pass filter signal processing element, as shown in FIG. 4. In FIG. 4, resistors R1 to R8 are connected to the respective outputs of the D-type flip flops. FIG. 5 shows a frequency response of moving average finite impulse response filter of FIG. 4. In FIG. 5, the frequency response produced is for the case when the values of the resistors R1 to R8 are all equal. Alternatively, the characteristics of the moving average finite impulse response filter frequency response can be shaped by individually varying the values of the resistors R1 to R8. Preferably, the values of the resistors R1 to R4 should correspond to the values of resistors R5-R8. The resistors R1-R8 form a low pass filter in combination with capacitor C1. Thus, the values of R1-R8 and C1 are chosen in combination in order to provide a moving average finite impulse response filter with the desired frequency response. For example, if the values of the resistors in a 7 stage finite impulse response filter are chosen as 1, 2, 3, 4, 3, 2, 1 a triangular impulse response is produced and the resulting finite impulse response filter has characteristic of a linear interpolator. Other combinations of resistor values can be chosen to give a Gaussian response as is known in the art. Of course, other embodiments of the invention may use a different filter or filters as part of a signal processing means to provide the analog audio signal from the 1-bit return to zero signal. For example, the signal processing means can be implemented as series of discrete low pass filters, or other known circuits in the art which have a filtering effect, in order to filter the 1-bit return to zero signal.

In some embodiments, only a single oversampling stage is used. The oversampling stage is connected to a sigma delta modulator, and the sigma delta modulator is connected to the bitstream converter. The sigma delta modulator and bitstream converter have been described previously. In such embodiments, the single oversampling stage has an oversampling factor of 256, although other oversampling factors can also be used.

Additionally or alternatively, one or more of the oversampling stages may also include a noise shaping filter. By including a noise shaping filter in the oversampling stage, the SNR of bitstream converter can be increased. Preferably, the noise shaping filter of the oversampling stage has an order of at least 2, 3 or 4. By increasing the order of the noise shaping filter, the SNR of the converter can be further increased.

The invention claimed is:

1. A bitstream converter for converting a 1-bit pulse density modulated (PDM) bitstream signal into an analog audio signal, the bitstream converter comprising:
   a processor configured to process the 1-bit PDM bitstream signal using a return to zero clock having a frequency higher than a sampling frequency of the 1-bit PDM bitstream signal to output a corresponding 1-bit return to zero signal, wherein the processor is configured to process the 1-bit PDM signal to ensure a portion of each bit of the 1-bit PDM bitstream signal is zero for a duration which is based on the frequency of the return to zero clock; and
   signal processing means configured to extract the analog audio signal from the 1-bit return to zero signal by filtering the 1-bit return to zero signal,
   wherein the return to zero clock frequency is at least 4 times the sampling frequency of the 1-bit PDM bitstream signal.

2. A bitstream converter according to claim 1, wherein the signal processing means includes one or more filters to filter the 1-bit return to zero signal.

3. A bitstream converter according to claim 1, wherein the signal processing means includes one or more low-pass filters to filter the 1-bit return to zero signal.

4. A bitstream converter according to claim 1, wherein the signal processing means is configured to extract the analog audio signal from the 1-bit return to zero signal by demodulating the 1-bit return to zero signal.

5. A bitstream converter according to claim 1, wherein: the signal processing means includes a low-pass finite impulse response filter configured to filter noise resulting from the processing of the 1-bit PDM bitstream signal to output the corresponding 1-bit return to zero signal.

6. A bitstream converter according to claim 5, wherein the low pass finite impulse response filter is configured to attenuate frequencies above 1 MHz by at least 30 dB.

7. A bitstream converter according to claim 5, wherein the low-pass finite impulse response filter is a moving average finite impulse response filter.

8. A bitstream converter according to claim 7, wherein the moving average finite impulse response filter has an order of at least 2.

9. A bitstream converter according to claim 1, wherein the 1-bit return to zero signal is a 1-bit bipolar return to zero signal.

10. A bitstream converter according to claim 9, wherein the processor outputs the 1-bit bipolar return to zero signal as a differential signal.

11. A bitstream converter according to claim 10, wherein the processor outputs a 1-bit unipolar return to zero signal and a complimentary 1-bit unipolar return to zero signal to differentially output the 1-bit bipolar return to zero signal.

12. A bitstream converter according to claim 1, further comprising an oversampling stage, the oversampling stage configurable to oversample an input bitstream signal to provide the 1-bit PDM bitstream signal.

13. A bitstream converter according to claim 12, wherein the input bitstream signal is an input multi-bit bitstream signal, the oversampling stage configured to generate the 1-bit PDM bitstream signal from the input multi-bit bitstream signal.

14. A bitstream converter according to claim 12, wherein the oversampling stage oversamples a sampling frequency of the input bitstream signal by a factor of at least 32.

15. A bitstream converter according to claim 1, wherein the processor is a digital signal processor.

16. A digital-to-analog converter including the bitstream converter according to claim 1.

17. A method of bitstream conversion for converting a 1-bit pulse density modulated (PDM) bitstream signal into an analog audio signal, the method of bitstream conversion comprising:
    processing the 1-bit PDM bitstream signal using a return to zero clock having a frequency at least 4 times higher than a sampling frequency of the 1-bit PDM bitstream signal, to output a corresponding 1-bit return to zero signal, by processing the 1-bit PDM signal to ensure a portion of each bit of the 1-bit PDM signal is zero for a duration which is based on the frequency of the return to zero clock; and
    extracting the analog audio signal from the 1-bit return to zero signal by signal processing means by filtering the 1-bit return to zero signal.

18. A method of bitstream conversion according to claim 17, wherein filtering the 1-bit return to zero signal includes filtering the 1-bit return to zero signal with a finite impulse response filter to remove noise produced by processing the 1-bit PDM bitstream signal to provide the corresponding 1-bit return to zero signal.

19. A method of bitstream conversion according to claim 17 including oversampling an input bitstream signal to provide the 1-bit PDM bitstream signal.

20. An audio playback device comprising a bitstream converter according to claim 1.

* * * * *